(12) United States Patent
Saito

(10) Patent No.: US 8,057,966 B2
(45) Date of Patent: Nov. 15, 2011

(54) MANUFACTURING METHOD OF PHOTOMASK FOR MULTIPLE EXPOSURE AND SEMICONDUCTOR DEVICE MANUFACTURING METHOD USING ABOVE PHOTOMASK

(75) Inventor: Masato Saito, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 12/491,041

(22) Filed: Jun. 24, 2009

(65) Prior Publication Data
US 2010/0028788 A1    Feb. 4, 2010

(30) Foreign Application Priority Data

Jul. 31, 2008   (JP) ................................. 2008-198146

(51) Int. Cl.
*G03F 1/00*       (2006.01)
*G03C 5/00*       (2006.01)

(52) U.S. Cl. ........................................... 430/5; 430/394

(58) Field of Classification Search ................ 430/5, 30, 430/311, 312, 313, 394; 716/50–56
See application file for complete search history.

(56) References Cited

U.S. PATENT DOCUMENTS
2003/0219658 A1 * 11/2003 Shishido et al. ................ 430/30

FOREIGN PATENT DOCUMENTS
JP          2007-163686          6/2007
* cited by examiner

*Primary Examiner* — Stephen Rosasco
(74) *Attorney, Agent, or Firm* — Finnegan, Henderson, Farabow, Garrett & Dunner, L.L.P.

(57) ABSTRACT

A position deviation and an image of a danger control pattern predicted after multiple exposure of each mask used for multiple exposure are acquired and an image after lap exposure by means of the masks based on the above image and position deviation information. At this time, parameters such as an offset amount caused by overlapping of images of the masks, rotation amount and the like are changed and a parameter capable of avoiding occurrence of faults in a dangerous pattern in an image predicted after lap exposure is calculated.

9 Claims, 9 Drawing Sheets

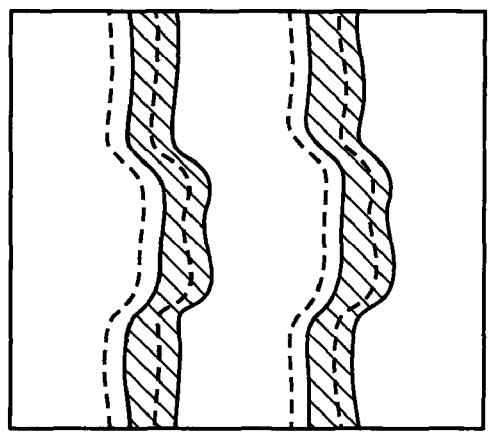
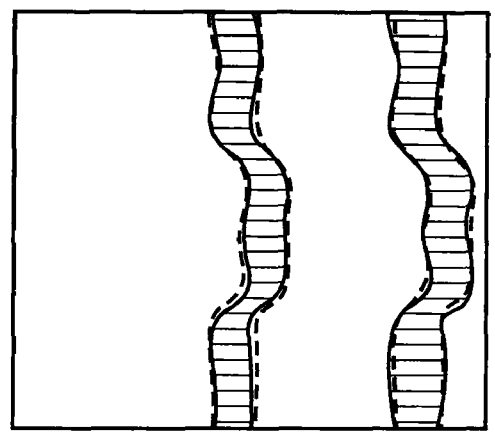
FIG. 4A    FIG. 4B
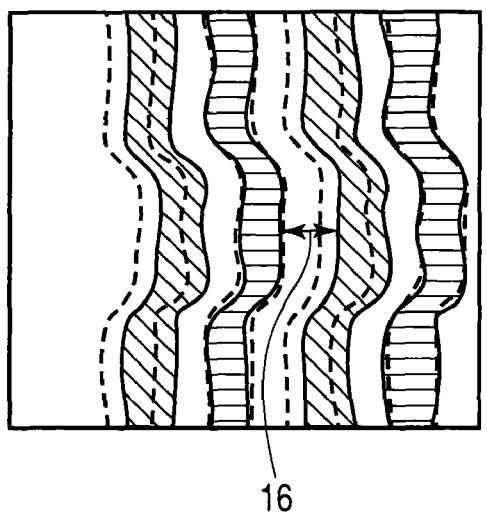
16
FIG. 5

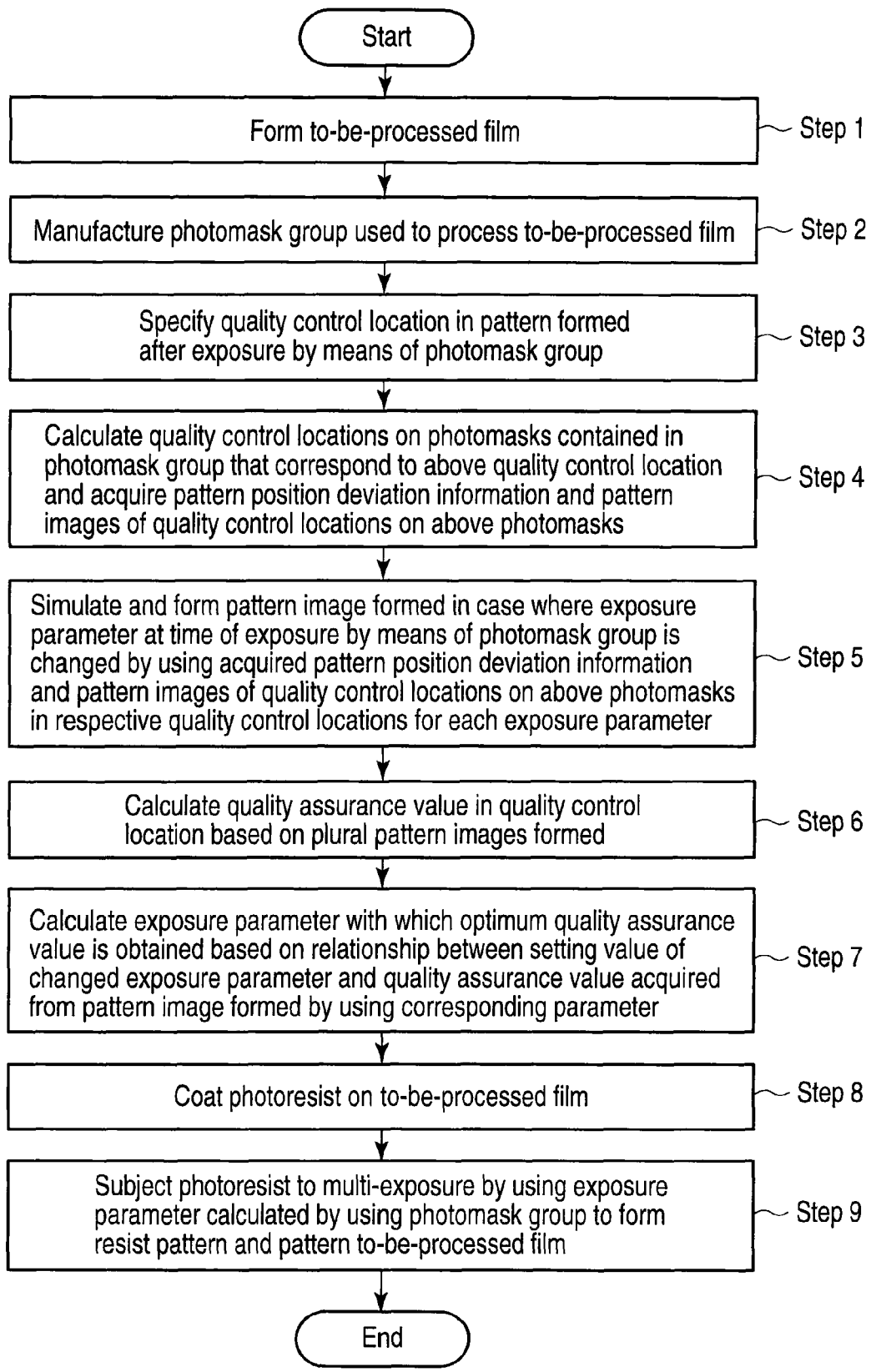
F I G. 8

First photomask

Second photomask

Wafer exposed by means of first and second photomasks

MANUFACTURING METHOD OF PHOTOMASK FOR MULTIPLE EXPOSURE AND SEMICONDUCTOR DEVICE MANUFACTURING METHOD USING ABOVE PHOTOMASK

CROSS-REFERENCE TO RELATED APPLICATIONS

This application is based upon and claims the benefit of priority from prior Japanese Patent Application No. 2008-198146, filed Jul. 31, 2008, the entire contents of which are incorporated herein by reference.

BACKGROUND OF THE INVENTION

1. Field of the Invention

This invention relates to a method for manufacturing a photomask used in a photolithography process for manufacturing semiconductor devices and a method for manufacturing semiconductor devices by using the above photomask.

2. Description of the Related Art

Recently, extremely severe precision has been more strongly required for a photomask used in a photolithography process as semiconductor devices are more increasingly downsized. Further, the pattern of the photomask is subjected to optical proximity correction (OPC) and the number of patterns having complicated shapes is increased. Therefore, it is insufficient to ensure the quality of the photomask by a one-dimensional evaluation method such as a simple pattern dimension measurement method and it is required to use a two-dimensional pattern shape control method.

In order to meet the above requirement, the following method for checking whether or not a mask pattern is finished with desired precision is proposed. First, an image of a mask pattern is acquired by means of a scanning electron microscope (SEM) and a pattern shape after lithography is calculated by simulation based on pattern contour data extracted from the image. Then, whether or not a mask pattern is finished with desired precision is checked based on whether or not a desired degree of lithography margin can be attained by using the thus calculated pattern shape. The merit of this method is that the finishing degree of the mask pattern can be determined in a state extremely close to the condition in which the pattern is actually used and exposed onto a wafer. As a result, necessary and sufficient control can be realized without performing unnecessarily strict control or lax control.

For example, in Jpn. Pat. Appln. KOKAI Publication No. 2007-163686, a method attained by further expanding the above method to manage the finishing degree of a photomask is proposed. That is, a lithography simulation is run by deriving not only pattern contour data but also a 3-dimensional shape on the photomask based on a pattern image by means of an SEM.

Further, as a method for further advancing shrinkage, a multiple exposure technique for forming a pattern by using a plurality of photomasks for one layer (to-be-processed film) formed on a wafer is proposed. For example, in the double-exposure technique, first, photoresist is coated on a to-be-processed film, the photoresist film is exposed by means of a first photomask and developed to form a resist pattern and the to-be-processed film is patterned by using the resist pattern. Subsequently, photoresist is newly coated on the thus patterned to-be-processed film, the photoresist film is exposed by means of a second photomask and developed to form a resist pattern and the to-be-processed film is further patterned by using the resist pattern. Thus, the to-be-processed film is processed into a pattern that is a combination of the patterns of the first and second photomasks.

When the multiple exposure technique is applied, the finishing precision of a pattern formed on the to-be-processed film on the wafer is determined by the precisions of the respective photomasks used. Further, it becomes necessary to determine not only the precisions of the individual photomasks but also the quality thereof by taking the mutual interaction into consideration. That is, even if the photomask is low in precision in a singular form and the pattern becomes faulty, the pattern will become good by the mutual interaction between plural photomasks. For example, a line-form pattern defined by edge positions and distances between the edge positions is considered. When a pattern is formed by means of a first photomask with the dimension thereof reduced by $\Delta$, the right-side pattern edge is moved to the left side by $\Delta/2$ and the left-side pattern edge is moved to the right side by $\Delta/2$. On the other hand, when a pattern is formed by means of a second photomask with the dimension thereof increased by $\Delta$, the left-side pattern edge is moved to the left side by $\Delta/2$ and the right-side pattern edge is moved to the right side by $\Delta/2$. In the above cases, if $\Delta$ is large, the first and second photomasks become faulty in the singular form. However, if a multiple exposure process is performed, the deviation amounts thereof cancel each other to set the relative distance between the pattern edges to a normal value and the pattern dimension is set to a desired value.

On the other hand, even if the precision of the photomask is sufficiently high in the singular form, deviations of plural photomasks may be accumulated and the deviation amount may be increased by the mutual interaction between the plural photomasks, and as a result, the sufficiently high precision cannot be attained in some cases.

Thus, when the multiple exposure technique is used, it is necessary to take the mutual interaction between the plural photomasks used for patterning the same layer (to-be-processed film) on the wafer at the time of quality control of a to-be-formed pattern. Therefore, a satisfactory result cannot be attained simply by determining whether the pattern is good or not by a lithography simulation based on pattern images acquired by means of individual photomasks.

Thus, it is desired to provide a photomask manufacturing method capable of enhancing the dimensional precision on a wafer while avoiding occurrence of faults after multiple exposure and a semiconductor device manufacturing method using the above photomask.

BRIEF SUMMARY OF THE INVENTION

According to one aspect of the present invention, there is provided a photomask manufacturing method for manufacturing a photomask group used to manufacture semiconductor devices and process a single layer, comprising specifying a quality control location on a pattern formed after exposure by means of the photomask group, calculating quality control locations lying on photomasks contained in the photomask group and corresponding to the above quality control location and acquiring pattern position deviation information and pattern images of the quality control locations on the photomasks, simulating and forming a pattern image formed in a case where an exposure parameter at the time of exposure by means of the photomask group is changed by using the acquired pattern position deviation information and the pattern images of the quality control locations on the photomasks in the respective quality control locations for each exposure parameter, calculating a quality assurance value in the quality control location based on a plurality of thus formed pattern images, and calculating an exposure parameter with which an optimum quality assurance value is obtained based on a relationship between a setting value of the changed exposure parameter and a quality assurance value acquired from the pattern image formed by using the corresponding parameter.

According to another aspect of the present invention, there is provided a semiconductor device manufacturing method comprising forming a to-be-processed film, specifying a quality control location on a pattern formed after exposure using a plurality of photomasks used to process the to-be-processed film, calculating quality control locations of the plurality of photomasks, which correspond to the quality control location, and acquiring pattern position deviation information and pattern images of the quality control locations on the plurality of photomasks, simulating and forming a plurality of pattern images formed in a case where an exposure parameter for exposure using the plurality of photomasks is changed in the respective quality control locations for each exposure parameter, using the acquired pattern position deviation information and pattern images of the quality control locations on the plurality of photomasks, calculating a quality assurance value in the quality control location based on the plurality of pattern images thus formed, calculating an exposure parameter with which an optimum quality assurance value is obtained based on a relationship between a setting value of the changed exposure parameter and a quality assurance value acquired from the pattern image formed using the corresponding exposure parameter, applying a first photoresist onto the to-be-processed film, inputting the calculated exposure parameter to a stepper to set exposure conditions of the first photoresist, exposing and developing the first photoresist with the calculated exposure parameter to form a first resist pattern, patterning the to-be-processed film using the first resist pattern, applying a second photoresist onto the patterned to-be-processed film, inputting the calculated exposure parameter to the stepper to set exposure conditions of the second photoresist, exposing and developing the second photoresist with the calculated exposure parameter to form a second resist pattern, and patterning the to-be-processed film using the second resist pattern.

BRIEF DESCRIPTION OF THE SEVERAL VIEWS OF THE DRAWING

FIGS. 4A and 4B are plan views each showing an image obtained by acquiring a pattern formed on a photomask by means of an SEM and then extracting the contour thereof;

FIG. 5 is a plan view showing a pattern image formed on a wafer after double exposure and acquired by simulation based on the pattern images obtained by means of first and second photomasks shown in FIGS. 4A and 4B;

FIG. 8 is a flowchart for illustrating a semiconductor device manufacturing method using the photomask manufacturing method shown in FIGS. 1 to 7;

DETAILED DESCRIPTION OF THE INVENTION

First Embodiment

A photomask manufacturing method according to a first embodiment of this invention is explained with reference to FIG. 1, FIGS. 2A to 2C, FIG. 3, FIGS. 4A and 4B, FIG. 5, FIG. 6 and FIG. 7. In this case, for example, a method for manufacturing a photomask group used to process a to-be-processed film (single layer) formed on a wafer and attaining the quality assurance of the photomask in order to assure the quality of a pattern formed on the wafer when the double-exposure technique using two photomasks is applied is explained.

Figure 1:
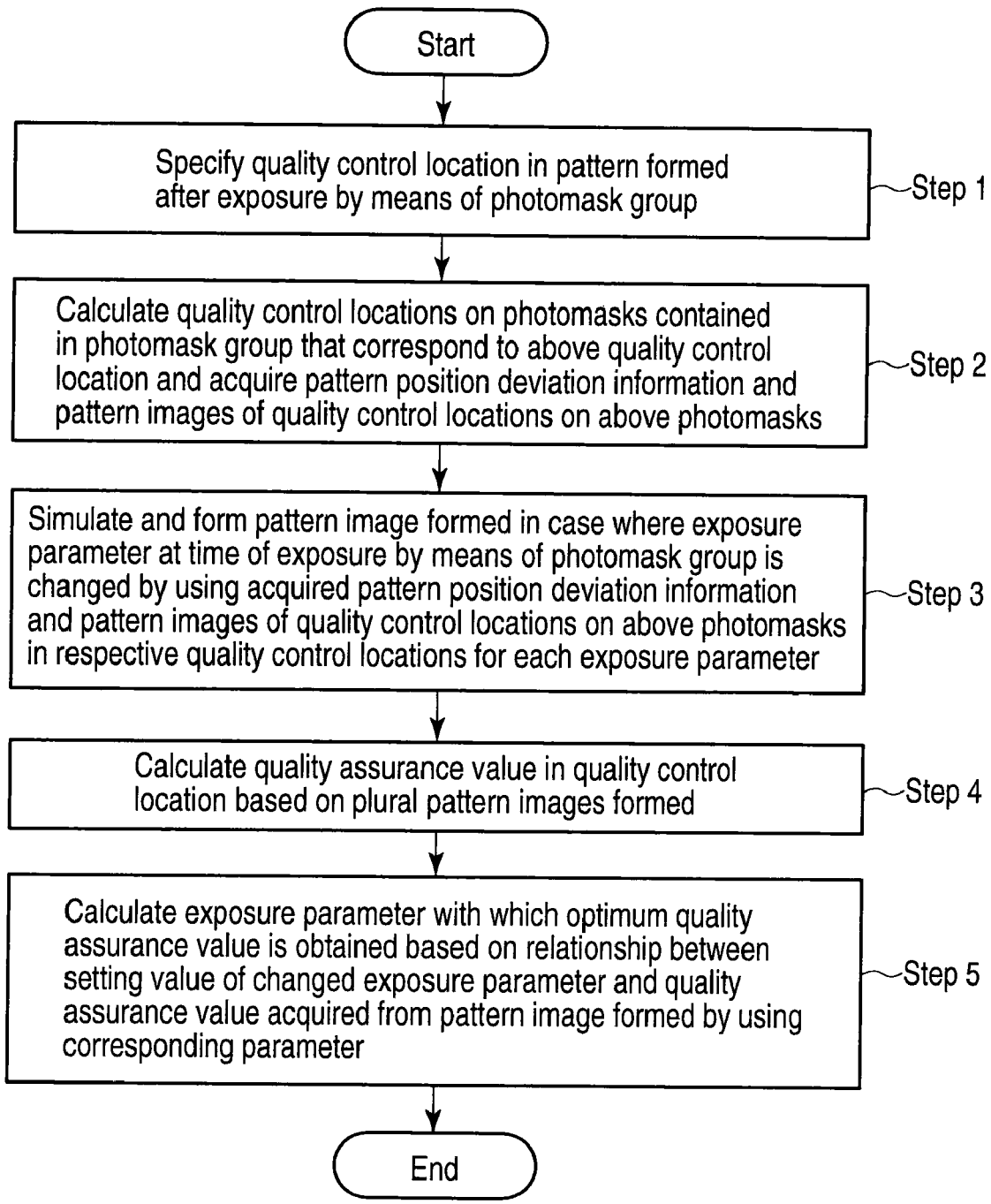
FIG. 1 is a flowchart for illustrating a photomask manufacturing method according to a first embodiment of this invention.
Figure 2A:
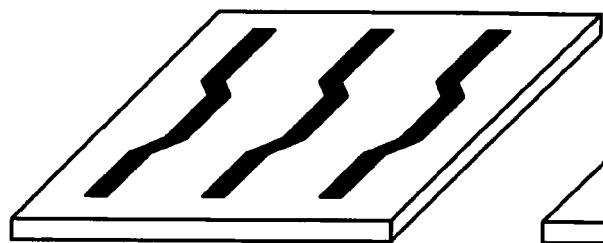
FIGS. 2A to 2C are perspective views for illustrating the principle of a double-exposure technique.
Figure 2B:
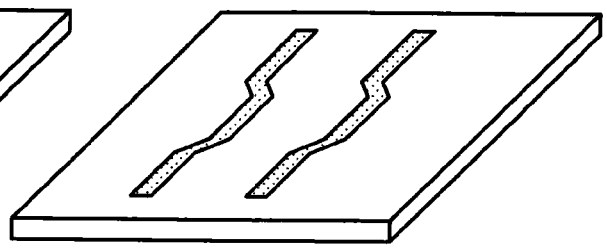
Figure 2C:
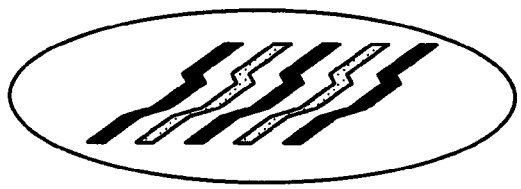
Figure 3:
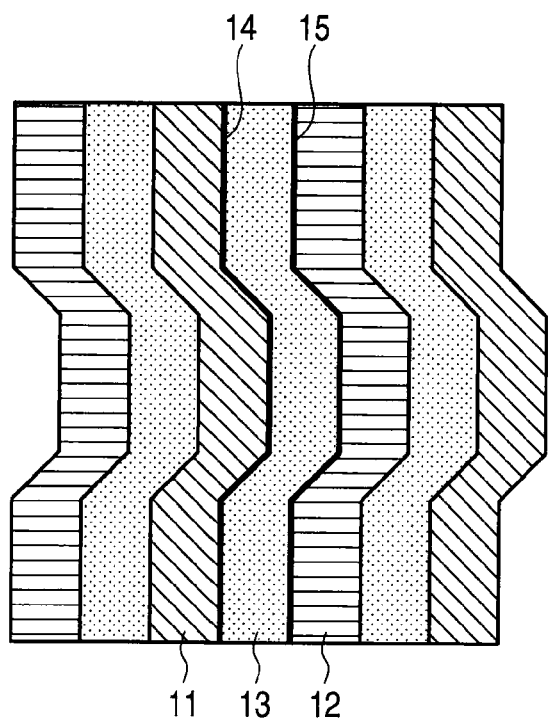
FIG. 3 is a plan view showing the shape of a pattern formed on a wafer by double exposure.
Figure 6:
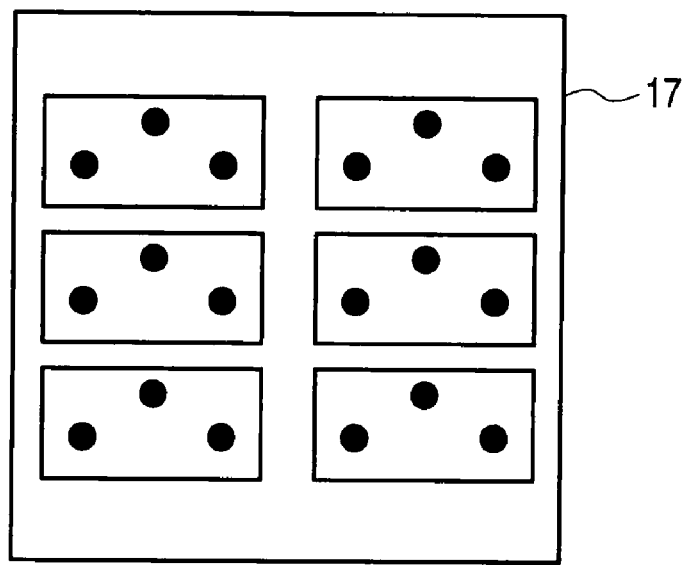
FIG. 6 is a pattern plan view showing quality control locations in a pattern region formed by means of the first and second photomasks.
Figure 7:
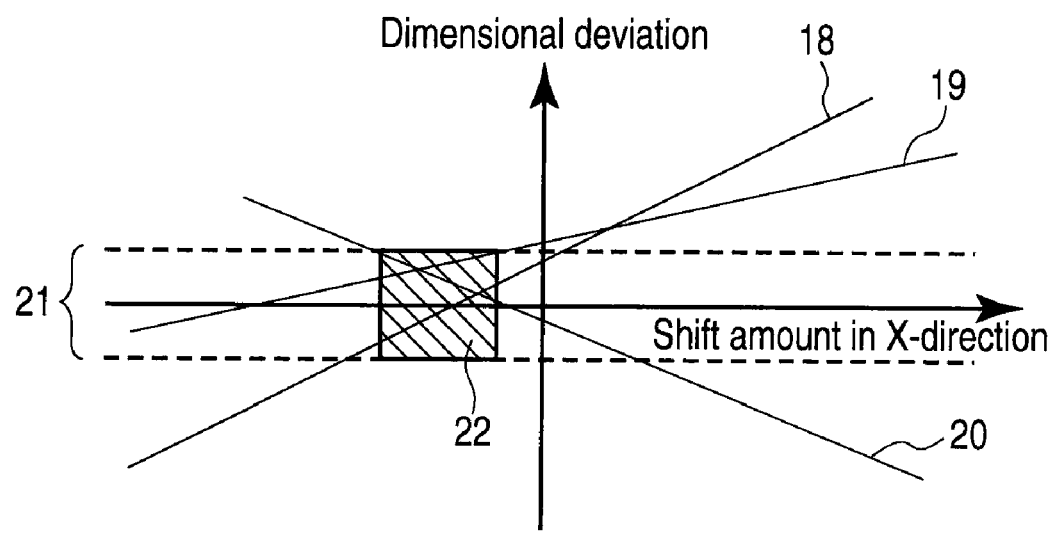
FIG. 7 is a diagram for illustrating variations in dimensional deviations in the respective quality control locations in a case where the shift amount in the X-direction is changed as an exposure parameter when exposure is made by means of the second photomask while a pattern exposed by means of the first photomask is set as a reference.

FIG. 1 is a flowchart for illustrating the photomask manufacturing method according to the embodiment of this invention, FIGS. 2A to 2C are perspective views for illustrating the principle of the double-exposure technique, FIG. 3 is a plan view showing the shape of a pattern formed on the wafer by double exposure, and FIGS. 4A and 4B are plan views respectively showing images obtained by acquiring patterns formed on photomasks by means of an SEM and then extracting the contours thereof. Further, FIG. 5 is a plan view showing a pattern image formed on the wafer after double exposure and acquired by simulation based on a pattern image obtained by means of first and second photomasks shown in FIGS. 4A and 4B, FIG. 6 is a pattern plan view showing quality control locations in a pattern region formed by means of the first and second photomasks, and FIG. 7 is a diagram for illustrating variations in dimensional deviations in the respective quality control locations in a case where the shift amount in the X-direction is changed as an exposure parameter when exposure is made by means of the second photomask while a pattern exposed by means of the first photomask is set as a reference.

In the photomask manufacturing method according to this embodiment, first, a first photomask as shown in FIG. 2A, for example, and a second photomask as shown in FIG. 2B, for example, that are used when a photoresist is exposed to pattern a to-be-processed film are formed. It is supposed that the photomasks are formed by means of the known technique.

Next, as shown in the flowchart of FIG. 1, quality control locations in a pattern as shown in FIG. 2C, for example, that is formed on the wafer after the photoresist is exposed by means of the first and second photomasks are specified (step 1).

In this case, the quality control location corresponds to a location in which the margin in photolithography is small and faults tend to occur, that is, a dangerous portion (hot spot) in photolithography and it is sufficient if at least one location is specified.

Quality control locations on the first and second photomasks corresponding to the above quality control location are calculated to acquire pattern images of the corresponding locations on the individual photomasks and acquire pattern position deviation information (step 2). The pattern position deviation information indicates a deviation of the center of gravity of an object pattern from the desired coordinate in an XY plane.

Subsequently, a pattern image to be formed in a case where exposure parameters set at the time of exposure by using the photomask group are changed is formed by simulation in each quality control location for each exposure parameter by using the acquired pattern position deviation information and pattern images in the quality control locations on the first and second photomasks (step 3). In this simulation, a pattern to be formed on the wafer when the first and second photomasks are superimposed is simulated. The external shape of the pattern can be observed by means of an SEM, but it is necessary to use not only the image but also position deviation information in order to observe a pattern of a dangerous portion. That is, it is necessary to check the positional shift and the relative distance from the pattern to perform double exposure. Briefly speaking, information of usage of the two photomasks is acquired in step 3. The exposure parameter includes at least one of the shift amount, rotation amount, focus value, magnification and exposure amount at the time of usage of the first and second photomasks. In this example, a pattern image obtained by changing the shift amount of a pattern formed by means of the second photomask in the X-direction with a pattern formed by means of the first photomask set as a reference is formed.

Next, a quality assurance value in the quality control location is calculated based on a plurality of thus formed pattern images (step 4). The quality assurance value contains at least one of the dimensional deviation, dimensional variation, exposure margin and positional deviation.

Next, an exposure parameter with which an optimum quality assurance value can be acquired based on the relationship between the changed exposure parameter setting value and the quality assurance value acquired based on the pattern image formed by using the corresponding exposure parameter is calculated (step 5). If a mask pattern is superimposed on another mask pattern and exposure is made in this state, an error will occur in some cases. Therefore, an optimum value of the exposure parameter is detected by performing at least one of the operations of shifting the mask patterns in the XY-direction (changing the shift amount), reducing and transferring one of the mask patterns (changing the magnification), rotating one of the mask patterns (rotation amount), changing the foci thereof (focus amount) and changing the exposure amounts thereof or performing a desired combination of the above operations in a compound fashion.

Then, the exposure parameter calculated in step 5 is input to a stepper to set the exposure condition and perform exposure.

As described above, in the photomask manufacturing method according to this embodiment, information of a location (for example, a dangerous portion in photolithography) whose quality is desired to be assured on the wafer is replaced by information on the photomask side and a simulation is run on a corresponding location lying on the photomask side. That is, the information is replaced by information indicating positions of the two photomasks on which a pattern formed on the wafer lies, that is, the coordinates of the first and second photomask and then a simulation is run to finally create information of one portion of the wafer. Thus, the dimensional precision on the wafer can be improved while avoiding occurrence of faults after multiple exposure.

FIG. 3 shows the shape of a pattern formed on the wafer by double exposure. A symbol 11 denotes a pattern formed by means of a first photomask, 12 denotes a pattern formed by means of a second photomask and 13 denotes a pattern formed between the patterns formed by means of the first and second photomasks. Further, a symbol 14 denotes one of pattern edges configuring the pattern 13 which belongs to the pattern 11 formed by means of the first photomask and 15 denotes one of the pattern edges configuring the pattern 13 which belongs to the pattern 12 formed by means of the second photomask.

FIGS. 4A and 4B respectively show pattern images formed by means of the first and second photomasks and pattern position deviations in step 2. FIG. 4A shows the image acquired based on the first photomask and FIG. 4B shows the image acquired based on the second photomask. The patterns indicated by broken lines in the above drawing indicate the contours of patterns according to design data of corresponding patterns and the patterns indicated by solid lines indicate pattern images acquired by extracting the contours of images obtained by photographing patterns actually formed on the photomasks by means of an SEM. The position deviation is defined by a deviation between the center of gravity of the pattern indicated by the broken lines in the drawing and the center of gravity of the pattern indicated by the solid lines.

In step 3, the shape of a pattern formed after double exposure is predicted by simulation based on the pattern position deviation and the pattern images in the quality control locations acquired in step 2. At this time, a simulation is run by variously changing exposure parameters of the first and second photomasks at the exposure time to individually acquire pattern shapes in the respective quality control locations on the wafer in a state in which the respective exposure parameters are used.

FIG. 5 shows a pattern image formed on the wafer obtained as the result that a simulation is run by using standard values as the exposure parameters of the first and second photomasks and using the pattern position deviation and pattern images in desired quality control locations of the first and second photomasks shown in FIGS. 4A and 4B. An arrow 16 indicates the quality control location in the above drawing and it is supposed that a dimensional control operation is performed in this example.

In step 4, a quality assurance value is derived from the pattern images on the wafer corresponding to the respective exposure parameters in the quality control locations obtained by the simulation run in step 3 and an optimum exposure parameter is selected.

FIG. 6 shows quality control locations (black dots) in a pattern region 17 formed by means of the first and second photomasks. It is supposed that the processes of acquiring the pattern images in step 2 and step 3 and running the simulation to acquire an image after exposure are individually performed in each point indicated by the black dot in the drawing.

FIG. 7 is a graph showing the relationship between the exposure parameter and the control value. As the control value, a deviation (dimensional deviation) from a desired value of the pattern dimension in the quality control location indicated by the arrow 16 in FIG. 5 is used. Further, as the exposure parameter, a shift amount of the exposure position in the X-direction when exposure is made on a pattern formed by means of the first photomask by using the second photomask is used.

The X-axis in FIG. 7 indicates the shift amount and the Y-axis indicates the dimensional deviation. Lines 18 to 20 correspond to the calculation results of control values in the respective quality control locations shown in FIG. 6. A range 21 indicated by broken lines in FIG. 7 indicates the control width of a control value in the quality control location and it is determined that a pattern after exposure is faulty when the control value goes out of the control width. Since a region 22 indicated by oblique lines in FIG. 7 lies within the control width in all of the quality control locations that have been evaluated, the above range is selected as an optimum exposure parameter.

In this example, the shift amount in the X-direction is used as the exposure parameter, but the exposure parameter such as a Y-direction shift amount, rotation amount or magnification can also be used. Further, plural ones of the above exposure parameters can be used. As the quality assurance value, the pattern dimensional deviation is used, but an exposure margin, pattern dimensional variation or the like can also be used.

According to the above photomask manufacturing method, the dimensional precision on the wafer can be improved while avoiding occurrence of faults after multiple exposure.

FIG. 8 is a flowchart for illustrating a semiconductor device manufacturing method using the photomask manufacturing method described above.

First, a to-be-processed film that is a processing object is formed on a wafer (step 1). Further, a photomask group used for processing the to-be-processed film is formed (step 2). In the case of double exposure, a first photomask as shown in FIG. 2A and a second photomask as shown in FIG. 2B are formed. It is supposed that the photomasks are formed by means of the known technique.

Next, a quality control location on a pattern formed on the wafer after exposure is specified by means of the first and second photomasks (step 3). Then, quality control locations on the first and second photomasks that correspond to the above quality control location are calculated to acquire pattern position deviation information and pattern images of the corresponding locations of the respective photomasks (step 4). It is sufficient if at least one quality control location is specified.

Subsequently, a pattern image formed in a case where exposure parameters used when exposure is made by means of the first and second photomasks are changed is formed by simulation in each quality control location for each exposure parameter based on the pattern position deviation information and pattern images in the quality control locations on the first and second photomasks (step 5). In step 5, information of usage of two photomasks is acquired. The exposure parameter contains at least one of shift amounts of the first and second photomasks, rotation amounts, focus values, magnifications and exposure amounts. For example, a pattern image obtained by changing the shift amount of a pattern formed by means of the second photomask is formed while a pattern formed by means of the first photomask is set as a reference.

Next, a quality assurance value in each quality control location is derived based on a plurality of pattern images formed (step 6). The quality assurance value contains at least one of a dimensional deviation, dimensional variation, exposure margin and positional deviation.

Then, an exposure parameter with which an optimum quality assurance value is obtained based on the relationship between a setting value of the changed exposure parameter and the quality assurance value acquired from the pattern image formed by using the corresponding exposure parameter is calculated (step 7). If a mask pattern is superimposed on another mask pattern and exposure is made in this state, an error will occur. Therefore, an optimum value of the exposure parameter is detected by performing at least one of the operations of shifting the mask patterns in the XY-direction (changing the shift amount), reducing and transferring one of the mask patterns (changing the magnification), rotating one of the mask patterns (rotation amount), changing the foci thereof (focus amount) and changing the exposure amounts thereof or performing a desired combination of the above operations in a compound fashion.

Then, photoresist is coated on the to-be-processed film (step 8) and the exposure parameter calculated in step 7 is input to a stepper to set the exposure condition.

Next, the photoresist is subjected to multiple exposure by using the exposure parameter calculated by using the first and second photomasks to form a resist pattern and the to-be-processed film is patterned with the resist pattern used as a mask (step 9). More specifically, a first resist pattern is formed by exposing a photoresist with the exposure parameter calculated using the first photomask and then developing the exposed photoresist. The to-be-processed film is patterned with the first resist pattern. After that, a photoresist is applied again to the patterned to-be-processed film, and a second resist pattern is formed by exposing a photoresist with the exposure parameter calculated using the second photomask and then developing the exposed photoresist. Thus, the to-be-processed film is processed as a combined pattern of the first and second photomasks.

The to-be-processed film can be patterned not by using the first and second resist patterns but by using a first hard mask formed using the first resist pattern and a second hard mask formed using the second resist pattern.

According to the semiconductor device manufacturing method of this embodiment, the dimensional precision on the wafer can be improved while avoiding occurrence of faults after multiple exposure.

In this embodiment, an example of the double exposure is explained in order to simplify the explanation, but this invention can of course be applied to multiple exposure such as triple exposure or greater.

Second Embodiment

In a second embodiment, a method for assuring the quality of a photomask used to assure the quality of a pattern formed on wafer when the double exposure technique is used like the first embodiment is explained.

First, first and second photomasks are formed to pattern a to-be-processed film formed on a wafer (step 1). It is supposed that the photomasks are formed by means of the known technique.

Next, quality control locations on the respective masks corresponding to the above quality control location on the pattern formed on the wafer by means of the first and second photomasks are specified to acquire pattern images of the corresponding locations on the individual masks and acquire pattern position deviation information (step 2). In this example, it is supposed that two or more quality control locations are provided.

Figure 9A:
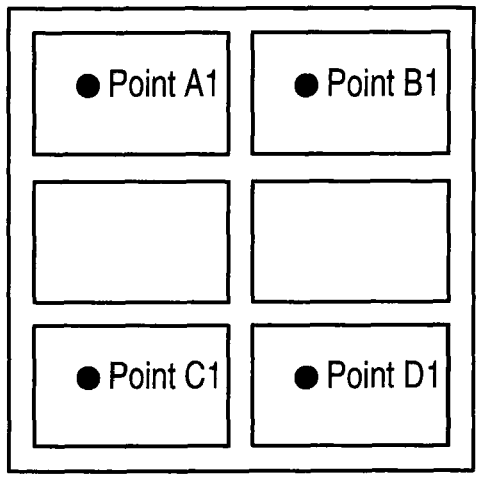
FIGS. 9A to 9C are plan views showing quality control locations on the first, second photomasks and wafer.
Figure 9B:
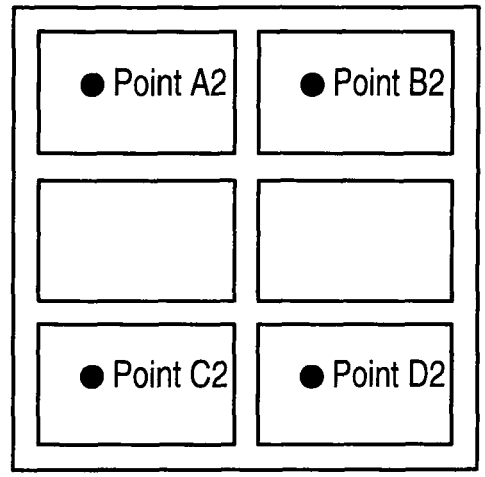
Figure 9C:
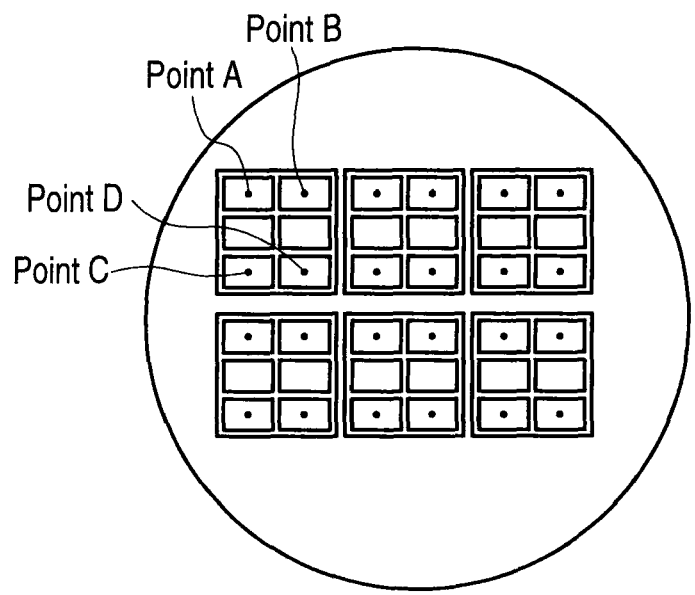

FIGS. 9A and 9B show quality control locations on the first and second photomasks and FIG. 9C shows a wafer exposed by means of the first and second photomasks. Quality control location points A1 to D1 on the first photomask shown in FIG. 9A and quality control location points A2 to D2 on the second photomask shown in FIG. 9B are those quality control locations on the first and second photomasks which respectively correspond to points A to D on the wafer shown in FIG. 9C.

Next, the shape of a pattern formed after double exposure is predicted by simulation based on the pattern position deviation information and the pattern images in the respective quality control locations acquired in step 2. At this time, a simulation is run by variously changing exposure parameters of the first and second photomasks at the exposure time to acquire individual pattern shapes in the respective quality control locations on the wafer in a state in which the respective exposure parameters are used (step 3).

Figures 10A, 10B:
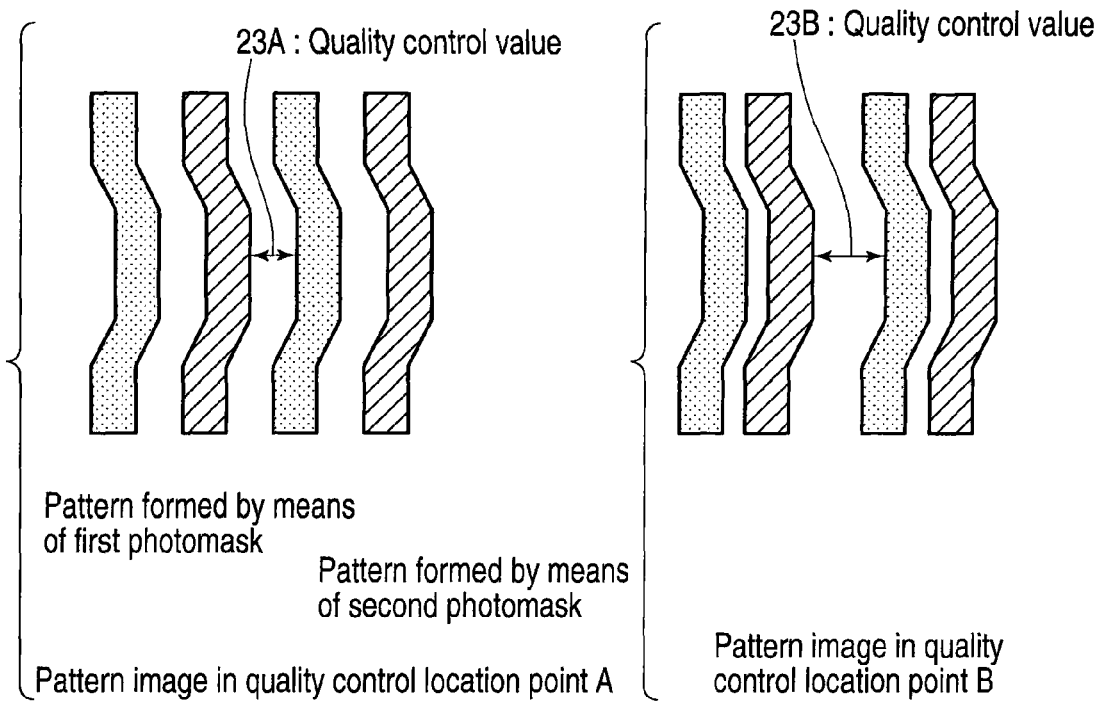
FIGS. 10A to 10D are pattern plan views respectively showing the results of calculations of pattern images on the wafer in the respective quality control locations by simulation when a standard value is used as the exposure parameter.
Figures 10C, 10D:
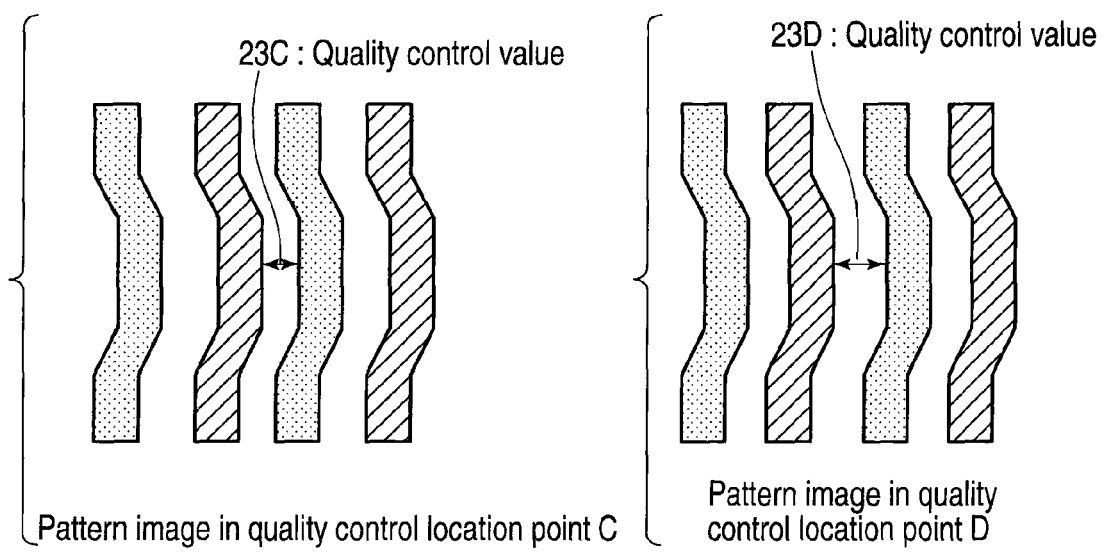

FIGS. 10A to 10D are pattern plan views respectively showing the results of calculations of pattern images on the wafer in the respective quality control locations by simulations when a standard value is used as the exposure parameter. FIG. 10A shows a pattern image in quality control location point A; FIG. 10B, a pattern image in quality control location point B; FIG. 10C, a pattern image in quality control location point C; and FIG. 10D, a pattern image in quality control location point D.

In this embodiment, deviation values of the dimensional values of portions indicated by arrows 23A to 23D in FIGS. 10A to 10D with respect to a desired value are used as control values.

In the respective quality control locations, control values are calculated based on pattern images by using the exposure parameters acquired by the simulation run in step 3 and an optimum exposure parameter is selected based on the relationship between the calculated control value and the exposure parameter (step 4).

Figure 11:
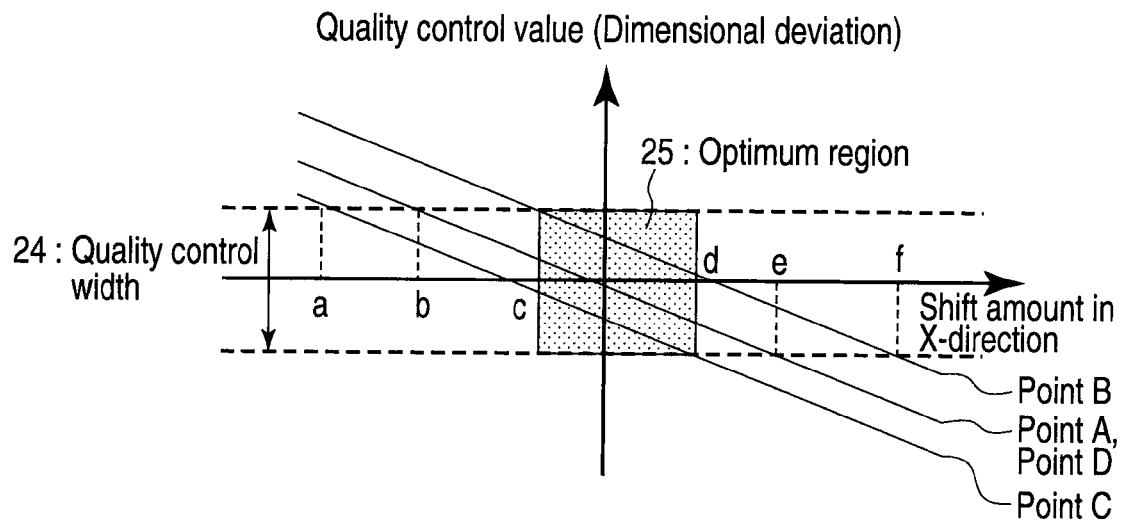
FIG. 11 is a diagram showing variations in control values calculated when the relative shift amounts of the first and second photomasks at the wafer exposure time are changed as the exposure parameter.

FIG. 11 shows a variation in the calculated control value when the relative shift amounts of the first and second photomasks at the wafer exposure time are changed as the exposure parameters. Respective straight lines correspond the results in the respective quality control locations.

That is, in quality control locations A and D, it is preferable to set the relative shift amount of the two photomasks to zero and the quality control value is set within the control width in a segment between shift amounts b and e. However, the optimum shift amounts are deviated in points B and C, the quality control values in the respective control points are set within quality control width 24 in a segment of shift amounts c to f in the case of point B and in a segment of shift amounts a to d in the case of point C. Therefore, a segment of shift amounts c to d in which the control values in all control points A to D are set within the control width is set as an optimum region 25 and the range is selected as an optimum exposure parameter. Further, a location of shift amount zero is set as an optimum value at which the error range containing all of the control locations becomes minimum.

Figure 12:
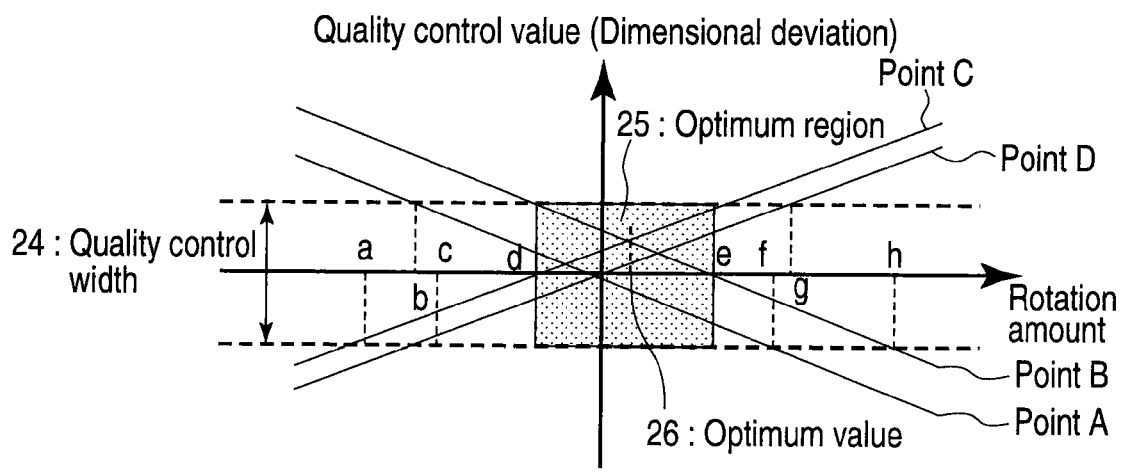
FIG. 12 is a diagram showing the relationship between the exposure parameter and the control value when the relative rotation amounts of the first and second photomasks are used as the exposure parameter.

FIG. 12 shows the relationship between the exposure parameter and the control value in a case where the relative rotation amounts of the first and second photomasks are used as the exposure parameters. In this case, the segment of d to e is selected as the optimum region 25. Particularly, a rotation amount 26 in FIG. 12 becomes an optimum value at which the error range containing all of the control locations becomes minimum.

Figure 13:
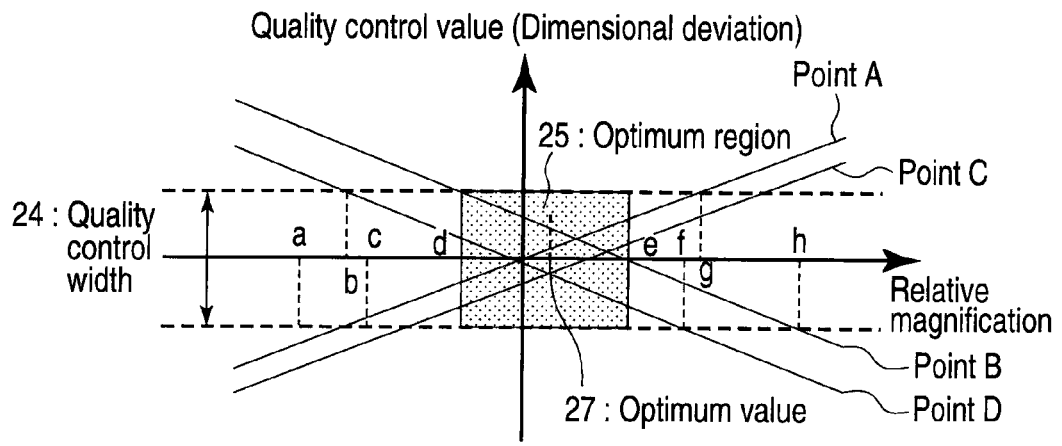
FIG. 13 is a diagram showing the relationship between the exposure parameter and the control value when the relative magnifications of the first and second photomasks are used as the exposure parameter.
Figure 14A:
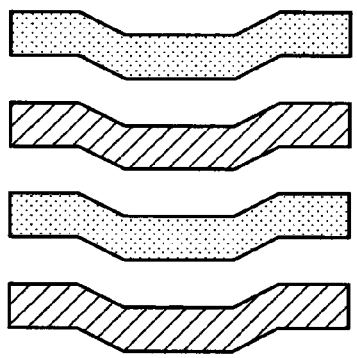
FIGS. 14A to 14D are plan views showing other pattern examples of control locations.
Figure 14B:
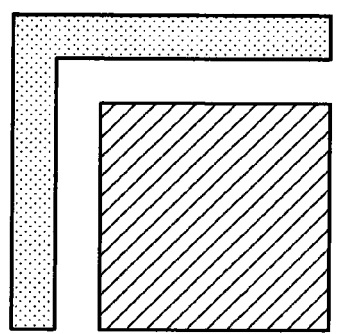
Figure 14C:
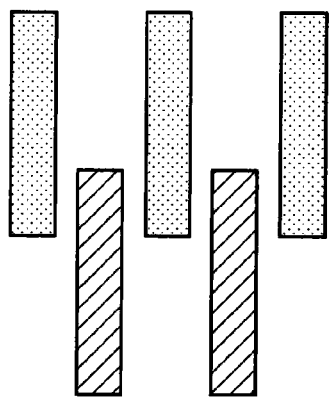
Figure 14D:
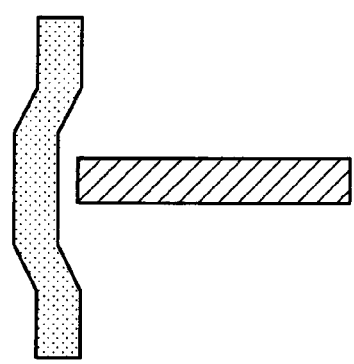

FIG. 13 shows the relationship between the exposure parameter and the control value in a case where the relative magnifications of the first and second photomasks are used as the exposure parameters. In this case, the segment of d to e is selected as the optimum region 25. Particularly, the relative magnification 27 in FIG. 13 becomes an optimum value at which the error range containing all of the control locations becomes minimum.

In this embodiment, the simulation is run by individually changing the shift amount in the X-direction, rotation amount and relative magnification as the exposure parameter. However, it is possible to simultaneously change a plurality of parameters and calculate the optimum region of the exposure parameters. In addition, it is possible to use a shift amount in the Y-direction, illumination amount or focus position shift amount as the exposure parameter.

Further, in this embodiment, the patterns as shown in FIGS. 10A to 10D are used as the control locations, but various patterns as shown in FIGS. 14A to 14D can be used and patterns with the shapes different depending on the control locations can be used.

Also, in this embodiment, the pattern dimensional deviation value is used as the quality assurance value, but a pattern dimensional variation, exposure margin or the like can be used.

The double exposure is explained as an example, but this invention can of course be similarly applied to multiple exposure such as triple or more exposure.

As described above, according to one aspect of this invention, a photomask manufacturing method capable of improving the dimensional precision on the wafer while avoiding occurrence of faults after multiple exposure and a semiconductor device manufacturing method using the photomask can be attained.

What is claimed is:

1. A photomask manufacturing method for manufacturing a photomask group used to manufacture semiconductor devices and process a single layer, comprising:
   specifying a quality control location on a pattern formed after exposure by means of the photomask group;
   calculating quality control locations lying on photomasks contained in the photomask group and corresponding to the quality control location on the pattern and acquiring pattern position deviation information and pattern images of the quality control locations on the photomasks;
   simulating and generating a pattern image to be formed on a single layer of a semiconductor device by a plurality of exposures using a plurality of the photomasks contained in the photomask group, in a case where an exposure parameter at the time of exposure by means of the photomask group is changed, by using the acquired pattern position deviation information and the pattern images of the quality control locations on the photomasks contained in the photomask group, in the respective quality control locations for each exposure parameter;
   calculating a quality assurance value in the quality control location based on a plurality of thus formed pattern images; and
   calculating an exposure parameter with which an optimum quality assurance value is obtained based on a relationship between a setting value of the changed exposure parameter and a quality assurance value acquired from the pattern image formed by using the corresponding parameter.

2. The photomask manufacturing method according to claim 1, wherein the quality control location is a location in which a margin in photolithography is small and faults tend to occur.

3. The photomask manufacturing method according to claim 2, wherein the location in which faults tend to occur is a hot spot in photolithography.

4. The photomask manufacturing method according to claim 1, wherein the pattern position deviation information is the deviation of the center of gravity of an object pattern from a desired coordinate in an XY plane.

5. The photomask manufacturing method according to claim 1, wherein the quality assurance value contains at least one of a dimensional deviation, dimensional variation, exposure margin and position deviation.

6. The photomask manufacturing method according to claim 1, wherein the exposure parameter contains at least one of a shift amount, rotation amount, focus value, magnification and exposure amount at the time of exposure by means of the photomask group.

7. The photomask manufacturing method according to claim 1, wherein the simulating and forming the pattern image is simulating and forming a pattern formed in a case where the exposure parameter at the time of exposure by means of the photomask group is changed by using the acquired pattern position deviation information and pattern images of the quality control locations on the photomasks in the respective quality control locations for each exposure parameter.

8. The photomask manufacturing method according to claim 1, wherein the calculating the exposure parameter is calculating an exposure parameter with which an optimum quality assurance value is obtained based on the relationship between the setting value of the changed exposure parameter and the quality assurance value acquired from the pattern image formed by using the corresponding exposure parameter.

9. The photomask manufacturing method according to claim 1, wherein the photomask group is used for multiple exposure.

* * * * *